Figure 1:
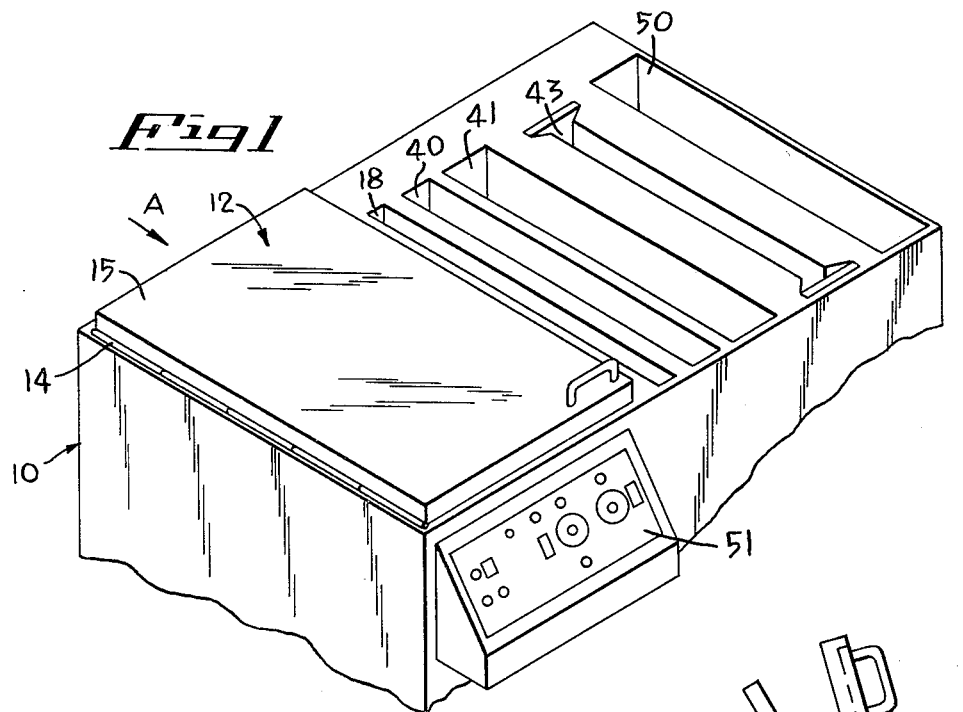

United States Patent [19]
Gygax et al.

[11] 3,973,847
[45] Aug. 10, 1976

[54] PRODUCTION OF GRAPHIC PATTERNS

[75] Inventors: Hans-Rudolf Gygax, Bottighofen; György Peregi, Neuhausen, Switzerland

[73] Assignee: Swiss Aluminium Ltd., Chippis, Switzerland

[22] Filed: July 8, 1974

[21] Appl. No.: 486,474

[30] Foreign Application Priority Data
Aug. 13, 1973 Germany............................ 2340961

[52] U.S. Cl.................................. 355/85; 354/325
[51] Int. Cl.²......................................... G03B 27/04
[58] Field of Search .................. 355/85, 86, 87, 99, 355/100, 106; 96/36; 354/317, 323–326

[56] References Cited
UNITED STATES PATENTS
3,528,358   9/1970   Pickard........................... 354/323 X
3,751,164   8/1973   Miller et al. ........................ 355/100

OTHER PUBLICATIONS

"Kodak Photosensitive Resists For Industry", First Edition, 1962, pp. 8, 10, 26–28, 36, 37.

*Primary Examiner*—R. L. Moses
*Attorney, Agent, or Firm*—Ernest F. Marmorek

[57] ABSTRACT

A device for producing graphic patterns such as inscriptions on a substrate covered with a light-sensitive layer, in particular on an oxidised aluminum sheet or on an oxidised aluminum foil stuck on to a plastic support film. The substrate is illuminated through a master pattern which has areas transparent to UV light. In a common housing there is provided an illuminating unit, with UV bulbs, a holding frame to press the master pattern onto the substrate, a developing, an etching, a rinsing and a stripping tank.

2 Claims, 7 Drawing Figures

PRODUCTION OF GRAPHIC PATTERNS

The invention concerns a device for the production of graphic patterns such as an inscription on a substrate covered with a light-sensitive plastic layer, in particular on an oxidised aluminum sheet or an aluminum foil stuck on to a plastic support film whereby the substrate is illuminated through a superimposed master pattern which allows UV light through its light areas.

In order to produce so called printed circuits it is known to cover a sheet of electrically conductive metal e.g. copper, on a support plate, with a layer of light-sensitive plastic, a so-called PR-layer (Photo Resist-layer), to expose a master pattern lying on this composite material to UV light which causes hardening of the PR layer under the transparent parts of the master pattern, to dissolve off the non-illuminated parts of the PR layer and then to etch away the metal layer under these non-illuminated places. This process has already found extensive application in the electrotechnical industry but has not been used to any extent worth mentioning in the graphics industry e.g. for the production of nameplates, data plates or instruction panels.

Such nameplates, panels etc. are usually made individually by an engraving process or in series by printing. This way of making nameplates is time consuming and requires qualified operators.

The object of the invention is to produce a device by means of which substrates, preferably metallic substrates can be provided with a pattern for example an inscription by unskilled labour in the shortest possible time.

A device in accordance with the invention to fulfil this objective is proposed in which there is provided in a common housing an illuminating part with UV bulbs and a holding frame for pressing the master pattern onto the substrate and bringing the same into the illuminating position, a developing tank for the application of a liquid developer on to the exposed surface, an etching tank which contains a liquid etchant heated to and thermostatically held at the etching temperature, a rinsing tank for rinsing with water between steps and a stripping tank containing a solvent to dissolve away the light-hardened plastic layer (PR layer).

In practice a plate can be produced in a period of less than 5 minutes using a device in accordance with the invention. Thereby an optical contrast is achieved by employing a sheet, for example an oxidised and coloured aluminum sheet giving a contrast between the bare etched aluminum and the coloured oxide layer or by employing a composite material consisting of an oxidised aluminum foil stuck on to a support layer giving a contrast between the plastic support film which may be coloured or transparent as desired and the coloured aluminum oxide layer.

The invention provides the possibility for every plate user, in particular the user of small numbers of nameplates to produce his plates himself without the usual long waiting time experienced when ordering plates which have to be produced by an engraving process or by printing and without having to accept the high purchase price of these processes.

Decorated plates manufactured using the device in accordance with the invention can find all imaginable kinds of application as e.g. nameplates, information panels, identification plates, instrument boards.

In a preferred design of the device there is provided in the developing tank a spraying device to spray the developer on to the exposed PR layer and such that the spraying device can be supplied from a choice of two pumps one of which is connected to a recirculation tank for used developer and the other to a tank of fresh developer. The spraying device is advantageously supplied, during the developing stage, mainly from the pump connected to the tank of used developer.

In order to prevent too much fresh developer from being used, in accordance with a further design of the invention there is provided a distillation chamber with a heating device to vaporise the developer, a cooler device to condense the vaporised developer and a collecting channel for the condensed liquid, the collecting channel being conected to the tank of fresh developer and the recirculation tank with the distillation chamber.

The described design of the developing unit ensures that the exposed metallic substrate is developed with a continuously uniform quality of developer and at the same time ensures optimum use of the developer since the fresh developer is also recovered by distillation from the recycling circuit.

The invention concerns too a process for the manufacture of graphic patterns on a metallic substrate which has a covering of light-sensitive plastic the said process being used in the described device. Such a process is, by way of the invention, characterized by the following operational steps which are at least partly automated and time controlled:

a. Illumination of the substrate through a superimposed master pattern which is transparent in its light areas.
b. Development of the illuminated substrate by removal of the unexposed areas of the light-sensitive plastic layer from the surface of the substrate.
c. Etching the metallic substrate on the places which are no longer covered by the light-sensitive plastic layer.
d. Rinsing the substrate with water.
e. Complete removal (stripping) of the remainder of the light-hardened PR layer.

The invention and advantageous details of the invention are explained further with the aid of schematic drawings relating to an example of the device and a description of the mode of working. The figures are as follows and show:

FIG. 1: A perspective view of a device in accordance with the invention with the lower part omitted in this figure.

Figure 2:
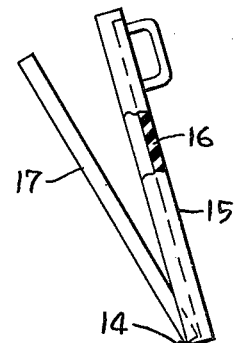
Figure 2:
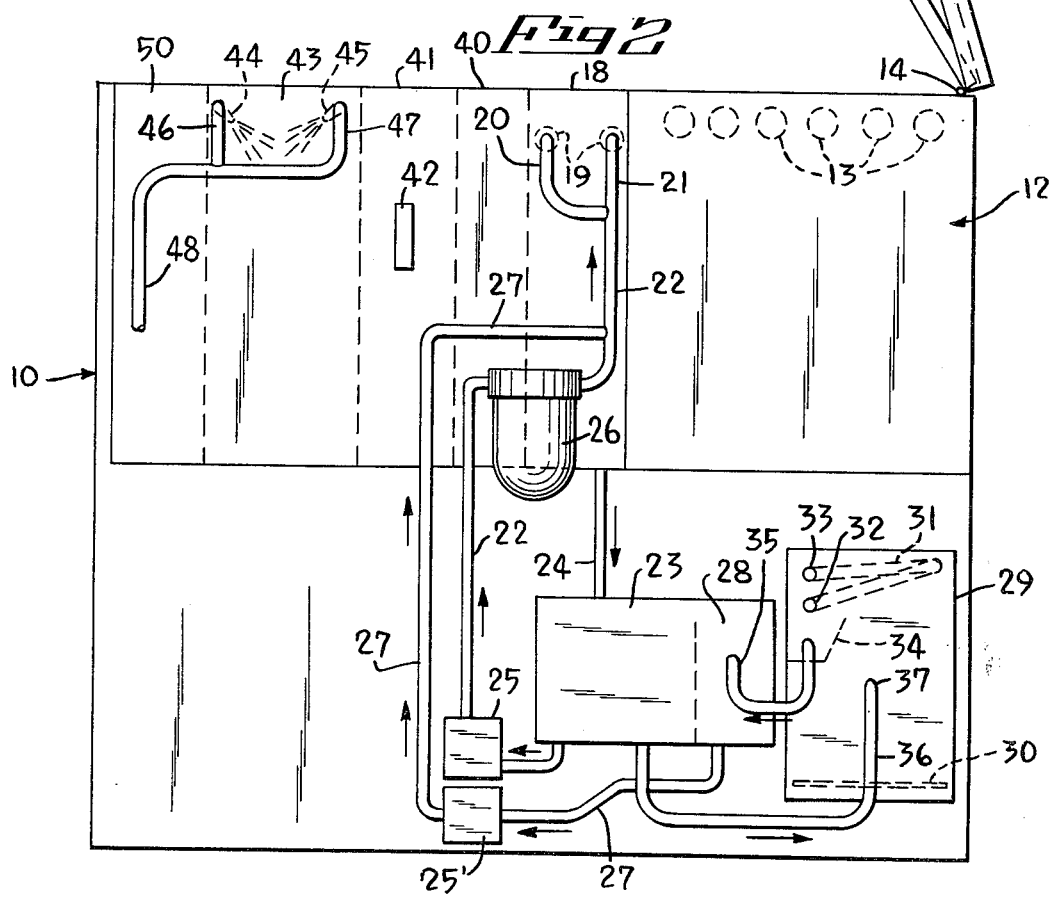

FIG. 2: A very schematic view of the back of the device shown in FIG. 1, in the direction of the arrow A in FIG. 1 whereby the covering part of the housing and other parts of the device have been left out of the drawing.

Figure 3:
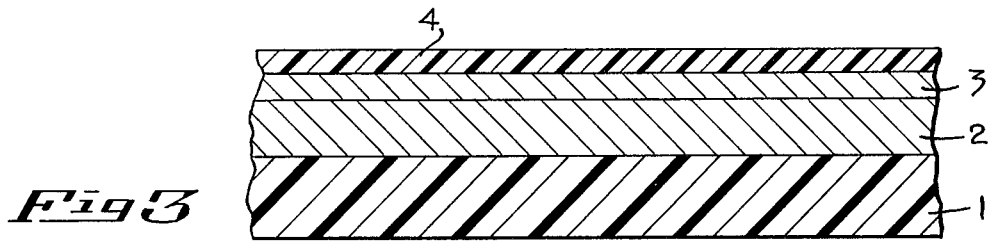

FIg. 3: A cross-section through a foil which is to be provided a graphic pattern using the device shown in FIGS. 1 and 2.

FIGS. 4 to 7: Cross-sectional views as in FIG. 3 of the foil at the various stages of producing a pattern with the device shown in FIGS. 1 and 2.

The device in FIGS. 1 and 2 has a housing 10 which can be moved on rollers not shown here.

In the housing 10 there is on the one side an illuminating part 12 with UV bulbs. The illuminating part is accessable from the top and can be uncovered via a lid 15 which hinges about a hinge 14. On the inner wall of the lid 15 there is a pressure mat 16 made of a material which yields e.g. rubber or from, which can have a ribbed surface.

Likewise, hinged about the hinge 14, there is a transparent glass plate 17 which on the housing 10 in the folded position as in FIG. 1, is surrounded by the edge of the lid 15. Between the glass plate 17 and the lid 15 a master pattern for example a film negative and a metallic substrate e.g. a piece of foil material, can be inserted so that the master pattern lies next to the glass plate 17 and the foil lies with its light sensitive plastic layer (PR = Photo Resist layer) facing the master pattern and between the master pattern and the lid 15.

On the right of FIG. 1 and in FIG. 2 on the left of the illuminating part 12 there is positioned a developing unit. The developing unit consists of a developing tank 18 in the upper part of which there are two parallel horizontal spray pipes 19. The spray pipes 19 have nozzle openings facing each other to spray developer in opposing directions. The spray pipes 19 are fed with developer from the branched upper ends 20, 21 of the supply line 22. The supply line 22 is connected to a recirculation tank 23 which is connected to the developing tank via an outlet pipe 24. In the supply line 22 there is fitted a pump 25 to recirculate the developer in the recirculation tank 23 and a filter 26.

The filter 26 is circumvented by a supply line 27 which connects to a tank 28 for fresh developer. There is a second pump 25' incorporated into the supply line 27. Neighbouring on to the tank 28 for fresh developer there is a distillation chamber 29. In the lower part of this distillation chamber there is a heating device 30 in the form of wires which can be electrically heated and these are embedded in silicon rubber. In the upper part of the distillation chamber there is a cooling coil 31 which is connected to a cooling circuit at the supply end 32 and the outlet end 33 for the coolant. The cooling coil is made to slope down towards a collecting channel 34 positioned on the side wall of the distillation chamber 29. The collecting channel 34 is connected to the tank 28 for fresh developer via a U-tube 35 and the distillation chamber 29 is connected to the recirculation tank 23 via a U-tube 36. The outlet 37 of the U-tube lies at a level above the heating device 30 but below the collecting channel 34. Only when the surface of the liquid in the recirculation tank 23 has reached the level of the outlet 37. can the developer from the recirculation tank 23 flow into the distillation chamber 29 to be distilled there and then via the collecting channel 34 to be led off to the tank 28 for fresh developer.

During the developing, the pump 25 is brought into service for a longer period of time e.g. 70 seconds and then the pump 25' is made to operate for a shorter period of time e.g. 10 seconds. This way the item to be developed is first sprayed with recycled, used developer and at the end of the development procedure with fresh developer. Thus a uniform quality of developing is ensured. During the operation of the pumps the developer flows in the direction of the arrows shown in FIG. 2.

Following on from the developing a drying step takes place in the drying chamber 40. The developed item can be dried there in a stream of air, possibly warm air, from a blower which is not shown here. In the chamber next in sequence, the etching tank 41, the developed part is immersed for a predetermined time in a heated etching fluid which is maintained at the correct temperature by a thermostat 42.

Next to the etching tank there is provided a rinsing tank 43 in which the residual etchant on the etched part is washed off with water. The water is sprayed on to the item from jets 44, 45 which are supplied from the supply line 48 via the pipes 46, 47.

Beside the rinsing tank 43 there is the last tank of the device, the stripping tank 50. In this tank there is a liquid with which the remainder of the light hardened part of the light-sensitive PR-layer is removed from the item.

The device is controlled during operation from a control panel 51.

A foil which can be provided with a pattern using the device shown in FIGS. 1 and 2 is shown in FIG. 3.

The foil in FIG. 3 has four layers. The bottom layer is a support foil 1 made of a pliable plastic e.g. unaffected by light, etchproof and heat-resistant polyester. The thickness of the support film 1 is at least 10 $\mu$m.

An aluminum foil 2 covers the support film 1 and is stuck on to it with an adhesive which is not shown here. The aluminum foil is 20–50 $\mu$m thick. The aluminum foil 2 has on its side facing away from the support film 1 an aluminum oxide layer 3 which is 4–10 $\mu$m thick. On the aluminum oxide layer 3 there is a layer 4 of a light-sensitive plastic, a so-called PR layer (Photo-Resist layer). The plastic of this PR layer has the property in the case of the so-called Negative-Positive process, of hardening when exposed to UV-light.

Not only can the aluminum oxide layer 3 be coloured but also the support film 1 can if desired have a contrasting colour. The support film 1 can also be transparent. Instead of the foil described above, an aluminum sheet or plate with a self coloured oxide layer and a PR layer on it, can be used as the metallic base.

Figure 4:
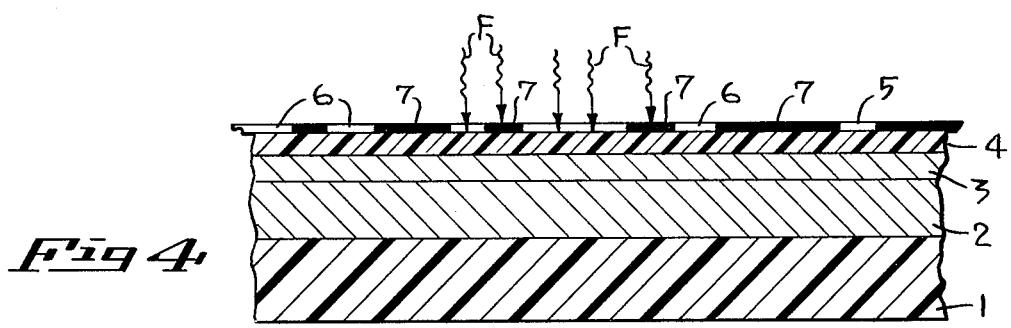

FIG. 4 shows the light exposure stage of producing a pattern on the foil. In this figure a master pattern e.g. in the form of a film negative 5, is positioned on the PR layer. The pattern has areas 6 which allow light through, and other areas 7, shown dark in the drawing, which do not allow light through. The pattern is now exposed to UV light travelling in the direction of the arrow F. The light beams are approximately parallel as they impinge on the pattern. On the light transparent areas 6 the pattern allows the light through to the PR layer which then hardens in these places. The PR layer under the non-transparent areas 7 remains unchanged.

The illustration in FIG. 4 is round the other way from that for the device shown in FIGS. 1 and 2 since the illumination in the device in these figures comes from below. Consequently the master pattern 5 must lie at the bottom and the PR-layer 4 on top of this.

Figure 5:
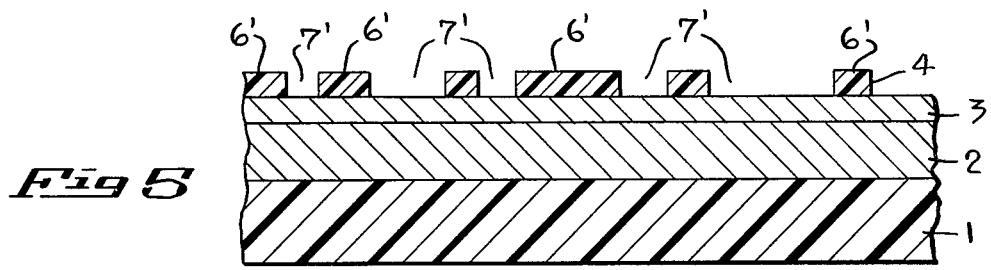

In the state shown in FIG. 5 the development takes place.

Thereby the foil is sprayed with developer in the developing tank 18. The developer removes those areas of the PR-layer which were under the dark places 7 in FIG. 4, so that hollows 7' are produced there. On the other hand those illuminated parts 6' of the PR-layer remain unchanged. In this way a faintly visible relief image of the master pattern is produced on the foil.

Figure 6:
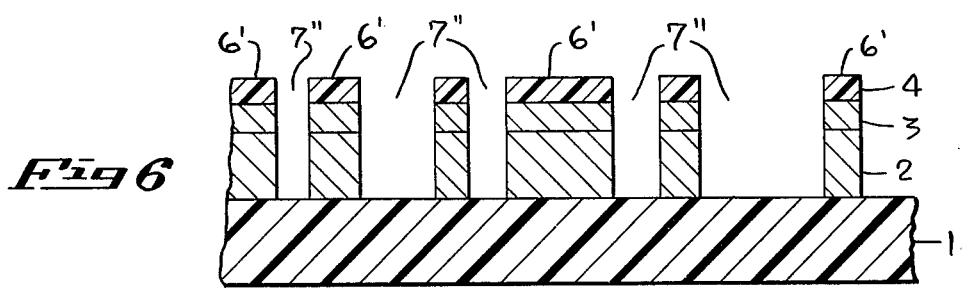
Figure 7:
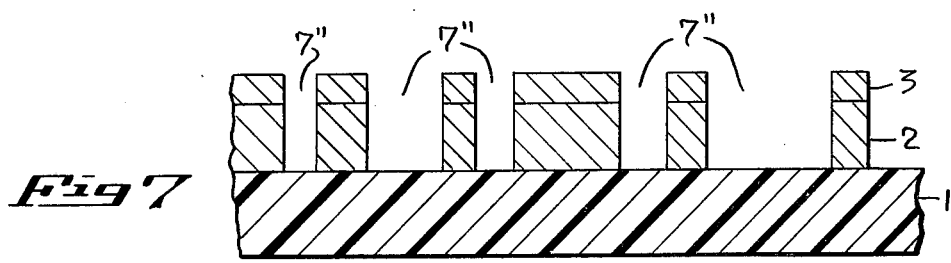

To make this image visible the layers 2 and 3, in those places just below where the PR layer was removed, are etched away right down to the substrate 1 using a liquid etchant, so that deeper hollows 7" result. Even if the side walls of the hollows 7" should not run as vertical to the substrate foil as shown in FIGS. 6 and 7 then such an accuracy can still be achieved on etching that the illuminated parts project up to the same order of magnitude as normal picture points. The picture points of the sample can in practice be so fine that grey and intermediate tones can also be reproduced.

On stripping in the stripping tank 50 the hardened places 6' of the PR-layer are removed with an organic solvent, in order to prevent damage to the resulting picture by fading of the parts of the PR-layer still present.

FIG. 7 shows the finished foil with pattern on it after stripping. This piece is provided with a long lasting pattern which, depending on the colouring of the aluminum oxide layer 3 and the colouring of the transparent or opaque support film 1, offers pictures of widely differing appearance and can find applications in the widest separated fields in particular as nameplates. The nameplate can be mounted on to a solid support plate or it can be secured directly on to the place of application. The latter offers the advantage that because of the flexibility of the foil it may be mounted around corners or edges.

What we claim is:

1. A device for producing graphic patterns such as inscriptions on a substrate covered with a light-sensitive layer, in particular on an oxidized aluminum sheet or on an oxidized aluminum foil secured to a plastic support film, whereby the substrate is illuminated through a master pattern which has areas transparent to UV light, comprising
    an illuminating unit including an ultraviolet light source and a holding frame operable to press the master pattern onto the substrate and to hold the pattern and the substrate in position to be exposed to illumination from said light source;
    a developing tank including a spraying device and being operable to treat the exposed substrate by spraying developer from said spraying device onto the substrate;
    a first storage tank for storing used developer;
    a first pump operably connected between said spraying device and said first tank for delivering used developer to said spraying device at predetermined time intervals;
    a second storage tank for storing fresh developer;
    a second pump operably connected between said spraying device and said second tank for delivering fresh developer to said spraying device at predetermined time sequences as required;
    a distillation chamber structure connected to said first storage tank and including a heating device to vaporize the developer from said first storage tank, a cooling device to condense the vaporized developer, and having a collecting channel for the condensate connected to said second storage tank, whereby used developer from said first storage tank is distilled and thereafter delivered to said second storage tank;
    an etching tank including a heater and a thermostat device cooperating for maintaining a liquid etchant in said etching tank at a predetermined temperature;
    a drying tank positioned between said developing tank and said etching tank and operable for drying the substrate after treatment in the developing tank;
    a water holding tank for rinsing said substrate; and
    a stripping tank operable for receiving and holding a solvent for the part of the light-sensitive layer hardened by the light.

2. In a device as claimed in claim 1, wherein the first tank is connected to the distillation tank by a connecting pipe the outlet to the distillation chamber of which is at a level above the point of connection with the first tank and is above the heating device, and that an overflow from the first tank is possible only when the surface of the liquid in the first tank has reached said level.

* * * * *